(12) United States Patent
Sato et al.

(10) Patent No.: US 9,383,408 B2
(45) Date of Patent: Jul. 5, 2016

(54) FAULT DETECTION SYSTEM, GENERATION CIRCUIT, AND PROGRAM

(71) Applicant: Kyushu Institute of Technology, Fukuoka (JP)

(72) Inventors: Yasuo Sato, Fukuoka (JP); Senling Wang, Fukuoka (JP); Kohei Miyase, Fukuoka (JP); Seiji Kajihara, Fukuoka (JP)

(73) Assignee: Japan Science and Technology Agency, Saitama (JP)

( * ) Notice: Subject to any disclaimer, the term of this patent is extended or adjusted under 35 U.S.C. 154(b) by 51 days.

(21) Appl. No.: 14/402,732

(22) PCT Filed: May 14, 2013

(86) PCT No.: PCT/JP2013/063393
§ 371 (c)(1),
(2) Date: Nov. 21, 2014

(87) PCT Pub. No.: WO2013/175998
PCT Pub. Date: Nov. 28, 2013

(65) Prior Publication Data
US 2015/0247898 A1    Sep. 3, 2015

(30) Foreign Application Priority Data
May 23, 2012  (JP) ................................. 2012-117842

(51) Int. Cl.
*G06F 11/00* (2006.01)
*G01R 31/317* (2006.01)
*G01R 31/3185* (2006.01)
*G01R 31/3177* (2006.01)

(52) U.S. Cl.
CPC ...... *G01R 31/31721* (2013.01); *G01R 31/3177* (2013.01); *G01R 31/318541* (2013.01); *G01R 31/318575* (2013.01)

(58) Field of Classification Search
CPC ................. G01R 31/31721; G01R 31/318541; G01R 31/318575
USPC ............ 714/736, 726, 724, 729, 733, 734, 30
See application file for complete search history.

(56) References Cited

U.S. PATENT DOCUMENTS

| | | | | |
|---|---|---|---|---|
| 7,979,765 B2 * | 7/2011 | Wen | ................. | G01R 31/31721 714/726 |
| 8,890,563 B2 * | 11/2014 | Lin | ................ | G01R 31/318575 324/73.1 |

(Continued)

FOREIGN PATENT DOCUMENTS

| | | |
|---|---|---|
| JP | 2009150823 A2 | 7/2009 |
| JP | 2010199106 A2 | 9/2010 |

(Continued)

OTHER PUBLICATIONS

International Search Report dated Aug. 20, 2013 filed in PCT/JP2013/063393.

*Primary Examiner* — Christine Tu
(74) *Attorney, Agent, or Firm* — Rankin, Hill & Clark LLP

(57) ABSTRACT

The purpose of the invention is to provide a fault detection system etc., that reduces shift power in scan-out while maintaining the fault coverage. The fault detection system configured to detect a fault in a logic circuit by means of a scan test, includes: multiple flip-flops; a final signal generation unit that generates a final signal indicating a final capture in a capture mode; an assignment unit that differs from the logic circuit and the flip-flops, and that sets a logic signal for a part of the flip-flops upon receiving the final signal; and a fault detection device that detects a fault by making a comparison between a test output captured from the logic circuit and including the logic value set by the assignment unit and a test output to be obtained when the logic circuit has no fault and including the logic value set by the assignment unit.

8 Claims, 8 Drawing Sheets

(56) References Cited

U.S. PATENT DOCUMENTS

2010/0218060 A1 8/2010 Nakako
2013/0185014 A1* 7/2013 Sinanoglu ............ G01R 31/28
                                                      702/117

FOREIGN PATENT DOCUMENTS

WO    2012046602 A1    4/2012
WO    2013105564 A2    7/2013

* cited by examiner

FAULT DETECTION SYSTEM, GENERATION CIRCUIT, AND PROGRAM

TECHNICAL FIELD

The present invention relates to a fault detection system, a generation circuit, and a program, and particularly relates to a fault detection system and the like that detects a fault that occurs in a logic circuit by means of a scan test.

BACKGROUND ART

In a scan test, an increase in power consumption leads to IR drop, a temporary drop in the power supply voltage. In some cases, this leads to a malfunction of a logic circuit, resulting in a scan flip-flop acquiring and holding an erroneous test response value. This leads to the occurrence of error in a test, in which a given logic circuit is judged to be defective even if it operates normally in a normal operation. As a result, such a test leads to yield loss. In particular, in a case in which a semiconductor logic circuit is configured with a very fine size on a very large scale and configured to operate with a low power supply voltage, such test error leads to a marked yield loss. Thus, it is important to reduce the power consumption in the scan test.

The power consumption in the scan test is roughly classified into two kinds, i.e., power consumption in a capture mode (capture power) and power consumption in a shift mode (shift power). Furthermore, the shift power is classified into two kinds, i.e., power consumption required for a scan-in operation and power consumption required for a scan-out operation. From among the aforementioned kinds of power consumption, the present inventors have developed a fault detection system which is capable of reducing the capture power (see Patent document 1) and a fault detection system which is capable of reducing the shift power required for a scan-in operation (see Patent document 2).

CITATION LIST

Patent Literature

[Patent Document 1]
International Publication WO 2012/046602
[Patent Document 2]
Japanese Patent Application No. 2012-002214

SUMMARY OF INVENTION

Technical Problem

However, such techniques are not capable of sufficiently reducing the shift power in a scan-out operation, as compared with a reduction in the shift power in a scan-in operation. That is to say, it is difficult to reduce the shift power in a scan-out operation because a change in a test output pattern before a shift-out operation defeats the purpose of the test.

For example, even in a case in which a test pattern that provides low shift power is generated using the technique disclosed in Patent document 2, there is a certain degree of difference between such a test pattern thus generated and a test pattern output from a test target circuit. However, it is needless to say that it is a main purpose of such a test to perform fault detection. Accordingly, the output test pattern should not be simply changed in order to reduce the shift power.

Thus, there is a demand for a technique for reducing the shift power in a scan-out operation.

Accordingly, it is a purpose of the present invention to provide a fault detection system and the like which is capable of reducing shift power in a scan-out operation while maintaining the fault coverage.

Solution of Problem

The first aspect of the present invention provides a fault detection system that detects, by means of a scan test, a fault that occurs in a logic circuit, the fault detection system comprising a plurality of flip-flops; a final signal generation unit that generates a final signal which indicates a final capture in a capture mode; an assignment unit that differs from the logic circuit and the flip-flops, and that assigns a logic value for a part of the flip-flops when the final signal is received; and a fault detection device that defects a fault by making a comparison between a test output captured from the logic circuit and that includes a logic value assigned by the assignment unit and a test output obtained in a case in which the logic circuit has no fault and that includes a logic value assigned by the assignment unit.

The second aspect of the present invention provides the fault detection system of the first aspect wherein the fault detection system performs multiple captures in the same capture mode, the fault detection system further comprising an acquisition circuit that connects directly to a part of or all of the flip-flops, without through another flip-flop, from which the acquisition circuit acquires a logic value; and a selection unit that selects a flip-flop for which the assignment unit assigns a logic value, and wherein the selection unit selects a flip-flop from among flip-flops connected to the acquisition circuit.

The third aspect of the present invention provides the fault detection system of the second aspect wherein the selection unit selects a flip-flop for which a logic value is to be assigned, preferentially from among flip-flops positioned in a region having a high toggle rate, flip-flops each having a large effect on scan-out power when they toggle, or flip-flops each having a logic value with a large difference from an average value of logic values of adjacent bits.

The fourth aspect of the present invention provides the fault detection system of the first aspect wherein the fault detection system performs multiple captures in the same capture mode, the fault detection system further comprising a selection unit that selects a flip-flop for which the assignment unit assigns a logic value, and wherein the selection unit selects a flip-flop from among flip-flops that each captures the same logic value at a final capture with a logic value captured immediately before the final capture.

The fifth aspect of the present invention provides the fault detection system of the fourth aspect wherein, in a case in which the selection unit selects a plurality of flip-flops from the same scan chain, the selection unit selects flip-flops such that they are not adjacent to each other, and wherein the assignment unit assigns, for each of selected flip-flops, a logic value of an adjacent flip-flop in the same scan chain.

The sixth aspect of the present invention provides the fault detection system of any one of the second through fifth aspects wherein the assignment unit assigns, for a flip-flop selected by the selection unit, one of logic values from among a constant logic value of 0 or otherwise 1, the same logic value with that of an adjacent flip-flop in the same scan chain, the same logic value with that of a flip-flop preceded by two flip-flops in the same scan chain, or a logic value determined with reference to logic values of a plurality of flip-flops.

The seventh aspect of the present invention provides a generation circuit in a fault detection system that detects, by means of a scan test, a fault that occurs in a logic circuit, configured to generate and supply a logic value to a flip-flop, wherein the generation circuit is configured as a circuit that differs from either the logic circuit or the flip-flop, and wherein the generation circuit supplies a logic value for the flip-flop after a final capture is performed in a capture mode.

The eighth aspect of the present invention provides a computer program capable of causing a computer to function as a fault detection unit for detecting, by means of a scan test, a fault that occurs in a logic circuit, wherein the fault detection unit makes a comparison between a test output captured from the logic circuit and that includes a logic value assigned by an assignment unit that differs from the logic circuit and a test output obtained in a case in which the logic circuit has no fault and that includes a logic value assigned by the assignment unit.

The ninth aspect of the present invention provides a fault detection method used in a fault detection system that detects, by means of a scan test, a fault that occurs in a logic circuit, the fault detection method comprising an assignment step in which a logic value is assigned for a flip-flop after a final capture is performed in a capture mode; and a fault detection step in which fault detection is performed by making a comparison between a test output captured from the logic circuit and that includes a logic value assigned in the assignment step and a test output obtained in a case in which the logic circuit has no fault and that includes a logic value assigned in the assignment step.

It should be noted that the assignment unit may be included in the flip-flops (FFs). Otherwise, the assignment unit may be arranged as an external component of the FFs.

Also, the assignment unit may select the FFs while prioritizing a flip-flop from among the flip-flops positioned on the scan-in side of the scan chain. This allows the shift power to be further reduced with higher efficiency.

Advantageous Effects of Invention

With the aforementioned aspects of the present invention, such an arrangement is capable of giving a new logic value to the output logic value (test output) captured finally by the FFs in the capture mode before performing fault detection. Thus, by appropriately selecting the FFs to be supplied with a new logic value and by appropriately selecting such a new logic value, such an arrangement provides a reduction in shift power in the scan-out operation while maintaining the fault coverage.

With an ordinary scan test, it is inconceivable that the test output signal output from the logic circuit to be subjected to the fault detection would be changed before the fault detection. The originality of the present invention is that the logic value of each selected FF is changed before the fault detection so as to reduce the shift power in the scan-out operation, based on the findings that the fault coverage can be maintained even if the logic values of the FFs that satisfy a predetermined condition are changed before the captured logic values are shifted out.

With the second aspect of the present invention, fault detection is performed multiple times in the same capture mode for the FFs connected to the acquisition circuit. Thus, there is no need to again shift out the logic values captured finally in the capture mode by such FFs connected to the acquisition circuit in the final stage. Thus, by supplying a new logic value to each of the FFs connected to the acquisition circuit, such an arrangement allows the shift power to be reduced more easily while maintaining the fault coverage.

With the third aspect of the present invention, such an arrangement provides an advantage of a marked reduction in the shift power.

With the fourth aspect of the present invention, by supplying a new logic value to the FFs that have each captured the same logic value in the final two captures, such an arrangement allows the shift power to be reduced. As described later regarding the experiment results obtained by the present inventors, this is because, when the same logic value is captured from a given FF in the final two captures, there is a high probability that such a FF does not contribute to improving the transition delay fault coverage. Thus, such an arrangement allows the shift power to be reduced more easily while maintaining the transition delay fault coverage.

With the fifth aspect of the present invention, such an arrangement is capable of supplying a logic value that has a high probability of reducing the shift power.

With the sixth aspect of the present invention, the assignment unit supplies the same logic value to adjacent FFs arranged in the same scan chain, thereby allowing the shift power to be reduced.

DESCRIPTION OF EMBODIMENTS

Description will be made regarding an embodiment of the present invention with reference to the drawings. It should be noted that embodiments of the present invention is by no means restricted to the following examples.

Example 1

Figure 1:
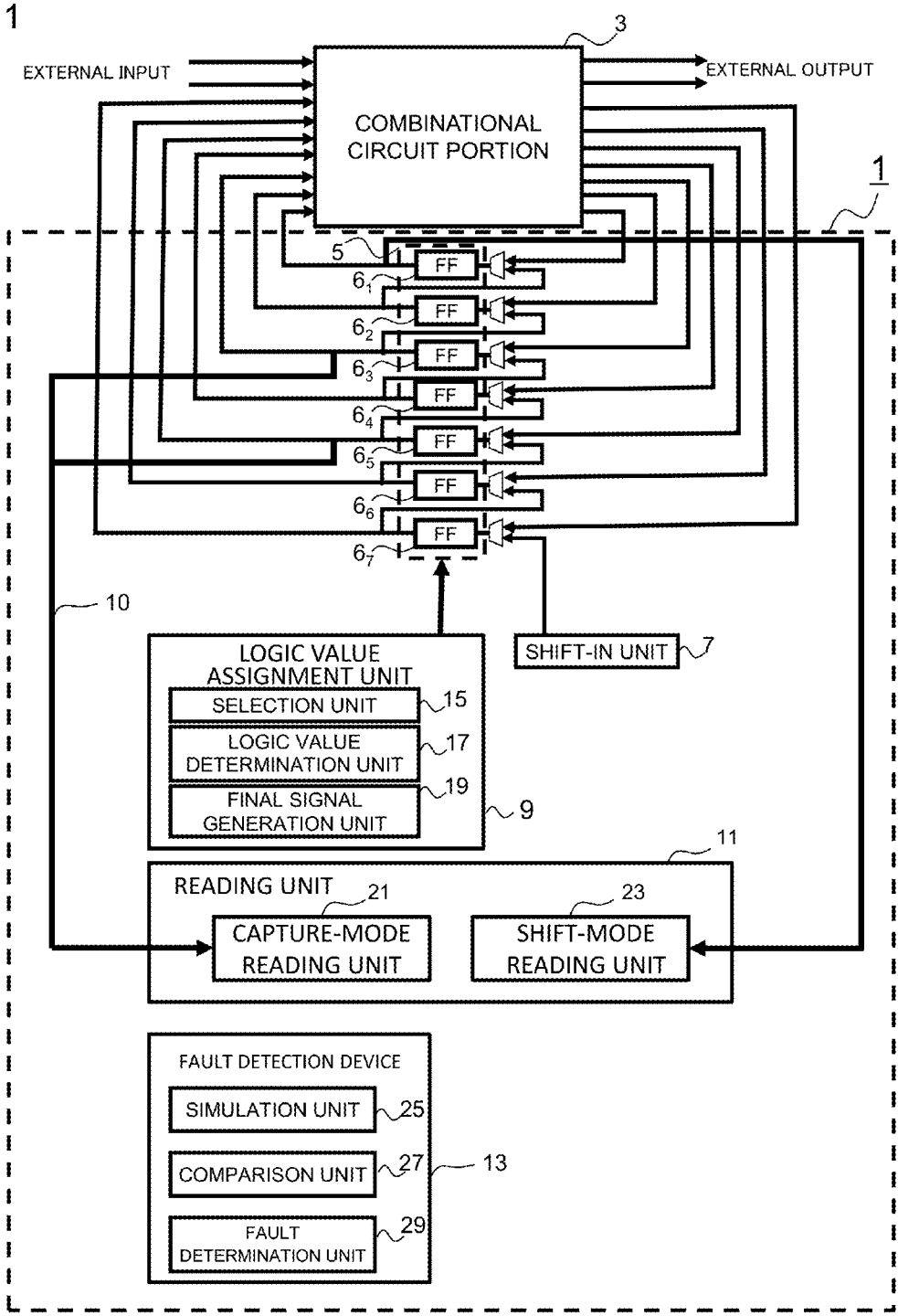
FIG. 1 is a block diagram showing a schematic configuration of a fault detection system 1 according to the example of the present invention.

FIG. 1 is a block diagram showing a schematic configuration of a fault detection system 1 according to the example of the present invention. Description will be made below regarding the schematic configuration of the fault detection system 1 shown in FIG. 1.

The fault detection system 1 (an example of a "fault detection system" in the claims) is configured to detect a fault that occurs in a combinational circuit portion 3 (an example of a "logic circuit" in the claims) by means of a scan test. The fault detection system 1 includes a storage circuit portion 5 that captures a logic value output from the combinational circuit portion 3, a shift-in unit 7 that shifts a logic value into the storage circuit portion 5, a logic value assignment unit 9 (an example of "assignment unit" in the claims) that assigns a logic value for the storage circuit portion 5 after the final capture, a reading unit 11 that reads out the logic value stored in the storage circuit portion 5, and a fault detection device 13 (an example of a "fault detection device" in the claims) that performs fault detection based on the logic value read out by the reading unit. The storage circuit portion 5 includes multiple flip-flops (FF) $6_n$ (n represents an integer of 2 or more) (an example of "flip-flops" in the claims). The multiple flip-flops FF $6_n$ form a single scan chain or otherwise multiple scan chains. Here, an acquisition circuit 10 (an example of an "acquisition circuit" in the claims) is connected to a part of the FFs, which allows a logic value to be acquired from a corresponding FF without involving the other FFs.

The logic value assignment unit 9 includes: a selection unit 15 (an example of a "selection unit" in the claims) that selects a FF or otherwise a scan flip-flop (SFF) for which a logic value is to be assigned; a logic value determination unit 17 that determines a logic value to be assigned for the selected FF or SFF; and a final signal generation unit 19 (an example of a "final signal generation unit" in the claims) that generates a final signal which indicates a final capture in a capture mode.

The reading unit 11 includes a capture-mode reading unit 21 that reads out the logic value acquired by the acquisition circuit 10 in the capture mode, and a shift-mode reading unit 23 that reads out the logic value shifted out in the shift mode. The fault detection device 13 includes a simulation unit 25 that calculates an expected value, a logic value which is expected to be output when the combinational circuit portion 3 operates normally, a comparison unit 27 that makes a comparison between the expected value calculated by the simulation unit 25 and a value read out by the reading unit 11, and a fault determination unit 29 that performs fault judgment based on a comparison result obtained by the comparison unit 27.

The logic value assignment unit 9 must assign a suitable logic value for an appropriate SFF in order to reduce the shift power while maintaining the fault coverage. The basic idea described here is that if a given SFF does not contribute to improving the fault coverage, such a SFF is supplied with the same logic value as that of an adjacent SFF in the scan chain.

The selection unit 15 selects such SFFs from among the SFFs connected to the acquisition circuit 10 in order to perform intermediate acquisition. This is because such SFFs have already contributed to the fault detection after the intermediate acquisition. Thus, a change in the logic values of such SFFs does not deteriorate the fault coverage. It is noted that other kinds of SFF selection methods may be applied according to the rules described later.

Also, when the same logic value is captured from a given SFF in the final two captures, the selection unit 15 may supply a new logic value to such a SFF so as to reduce shift power. This is because when the same logic value is captured from a given SFF in the final two captures, it is likely that such a FF holds the same value for many different patterns. Thus, it can be considered that there is a low probability of detecting a fault in such a FF. As a result, there is a high probability that such a FF does not contribute to the transition delay fault coverage. There are a great number of such FFs, which will be described below.

Table 1 shows the ratio of FFs each capturing logic values with almost no variation, which are listed for tested logic circuits. As the test target circuits, b14s, b15s, b20s, b21s, and b22s, each configured as an ITC99 benchmark circuit, were selected. Nearly half of the FFs have a logic value inversion ratio of 1% or less in the final capture for 30,000 input test patterns.

TABLE 1

| CIRCUIT | b14s | b15s | b20s | b21s | b22s |
|---|---|---|---|---|---|
| TOTAL NUMBER OF FFs | 245 | 449 | 490 | 490 | 735 |
| NUMBER (RATIO) OF FFs THAT FLIP AT A RATE OF 1% OR LESS | 131 (53%) | 271 (60%) | 230 (47%) | 234 (48%) | 440 (60%) |

Furthermore, the present inventors have confirmed that a change in the logic values held by such FFs leads to almost no reduction in the fault coverage. Table 2 shows an example of changes in fault detection coverages and specifically, the stuck-at fault coverage and the transition fault coverage. It should be noted that the logic values were assigned for 40% of all the FFs, that is, 20% of the FFs were connected to the acquisition circuit 10 and 20% of the FFs provided the same logic value in the final two captures.

It has been confirmed that, for all the circuits, such an arrangement provides the fault coverage maintained at the same level, or otherwise, decreased only by a ratio less than 0.1%. That is to say, it can be understood that, by suitably selecting such FFs, such an arrangement is capable of reducing the shift power required in the scan capture while maintaining the fault coverage.

TABLE 2

| | STUCK-AT FAULT COVERAGE (%) | | TRANSITION FAULT COVERAGE (%) | |
|---|---|---|---|---|
| CIRCUIT | ORIGINAL | LOGIC VALUE ASSIGNMENT | ORIGINAL | LOGIC VALUE ASSIGNMENT |
| b14s | 89.00 | 88.90 | 58.71 | 58.59 |
| b15s | 78.69 | 78.17 | 55.00 | 54.16 |
| b20s | 91.19 | 91.19 | 80.55 | 80.47 |
| b21s | 91.91 | 91.91 | 82.49 | 82.47 |
| b22s | 90.78 | 90.78 | 79.68 | 79.61 |
| AVERAGE | 88.31 | 88.19 | 71.29 | 71.06 |

Description will be made with reference to multiple examples regarding a circuit configuration configured to supply such a SFF with a logic value as a specified value. First, description will be made regarding an example circuit configuration that supplies a constant logic value to the selected SFF. It should be noted that, in the present example, the circuit of the logic value assignment unit 9 is configured for all the SFFs or otherwise a part of the SFFs when a logic circuit is designed. With such an arrangement, the selection unit 15 selects, from among the SFFs connected to the circuit of the logic assignment unit 9, the SFFs for which a logic value is to be assigned. Otherwise, a single logic value assignment unit 9 circuit may be formed for multiple SFFs, instead of an arrangement in which the logic value assignment unit 9 circuits are formed for each SFF.

Figure 2:
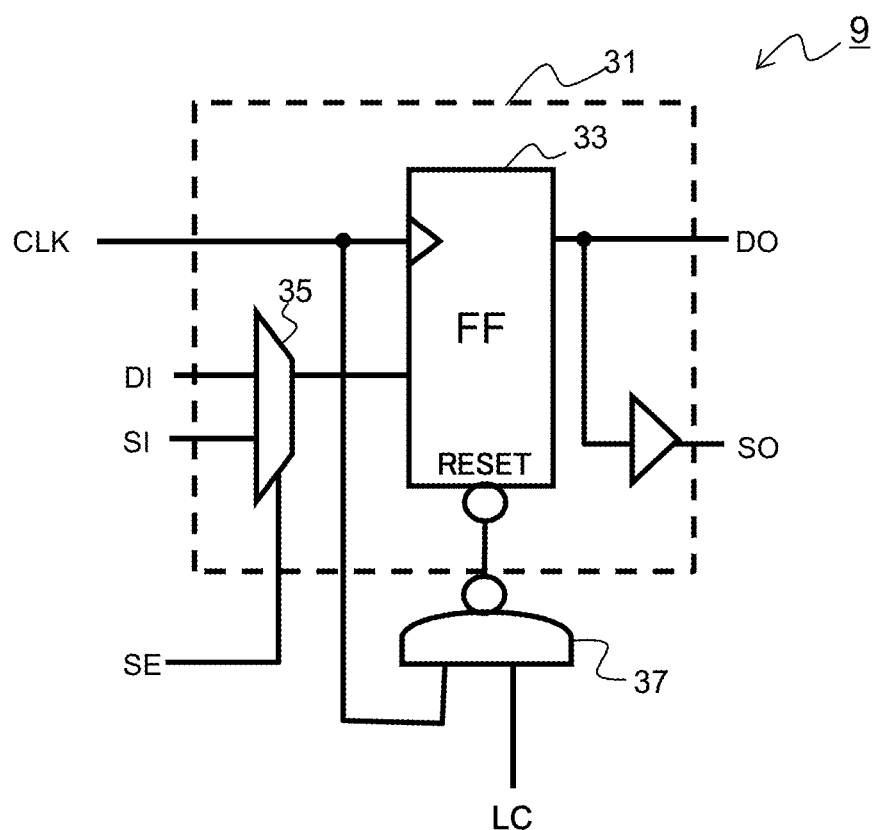
FIG. 2 is a diagram showing an example circuit configuration that provides a logic value of 0 to a scan flip-flop by means of reset input.

FIG. 2 is a diagram showing a circuit configuration of the logic value assignment unit 9 and a SFF 31 selected by the selection unit 15 according to the present example. In the drawing, a circuit configuration is shown as an example (an example of a "generation circuit" in the claims) configured to supply a logic value of 0 to the SFF using the reset input (Reset) included in the FF 33 included in the SFF 31.

As with ordinary SFFs, the FF 33 is connected to the output stream of a multiplexer 35 configured such that the output signal line (DI) from the combinational circuit portion 3 and the scan-in signal line (SI) are each connected as its input stream, and a scan-enable signal line (SE) is connected as its selection control input. Furthermore, the SFF 31 is arranged such that its reset terminal is connected to a NAND gate 37 configured to receive a final signal (LC) and a clock signal (CLK) as the input signals. The circle symbol shown on the reset terminal represents a low-active connection. That is to say, when a signal value of 0 is input, the reset is enabled, and 0 is output from SFF 31. The SFF 31 includes a data output line (DO) and a scan-out signal line (SO) as the output lines.

In the scan-capture mode, when the value of the final signal line connected to the NAND gate 37 is 0 in the scan-capture mode, the reset input is set to 1, which disables the reset. In this case, the SFF outputs the value of the DI signal. Conversely, when the signal value of the final signal line becomes 1, which means the final capture, the reset input becomes 0. In this case, the SFF 31 outputs 0. This allows the SFF 31 to output a logic value of 0 as a specified value after the final capture regardless of the logic value captured by the SFF 31 in the final capture. Shift power in a shift mode increases when logic values differ between adjacent SFFs in the scan chain. Thus, by supplying a logic value of 0 to the SFF 31 after the final capture when the logic value of an adjacent SFF is 0, such an arrangement allows the shift power to be reduced.

Also, the logic value assignment unit 9 may assign a logic value of 1 using the set input of the FF 33, instead of setting a logic value of 0 using the reset input of the FF 33.

Figure 3:
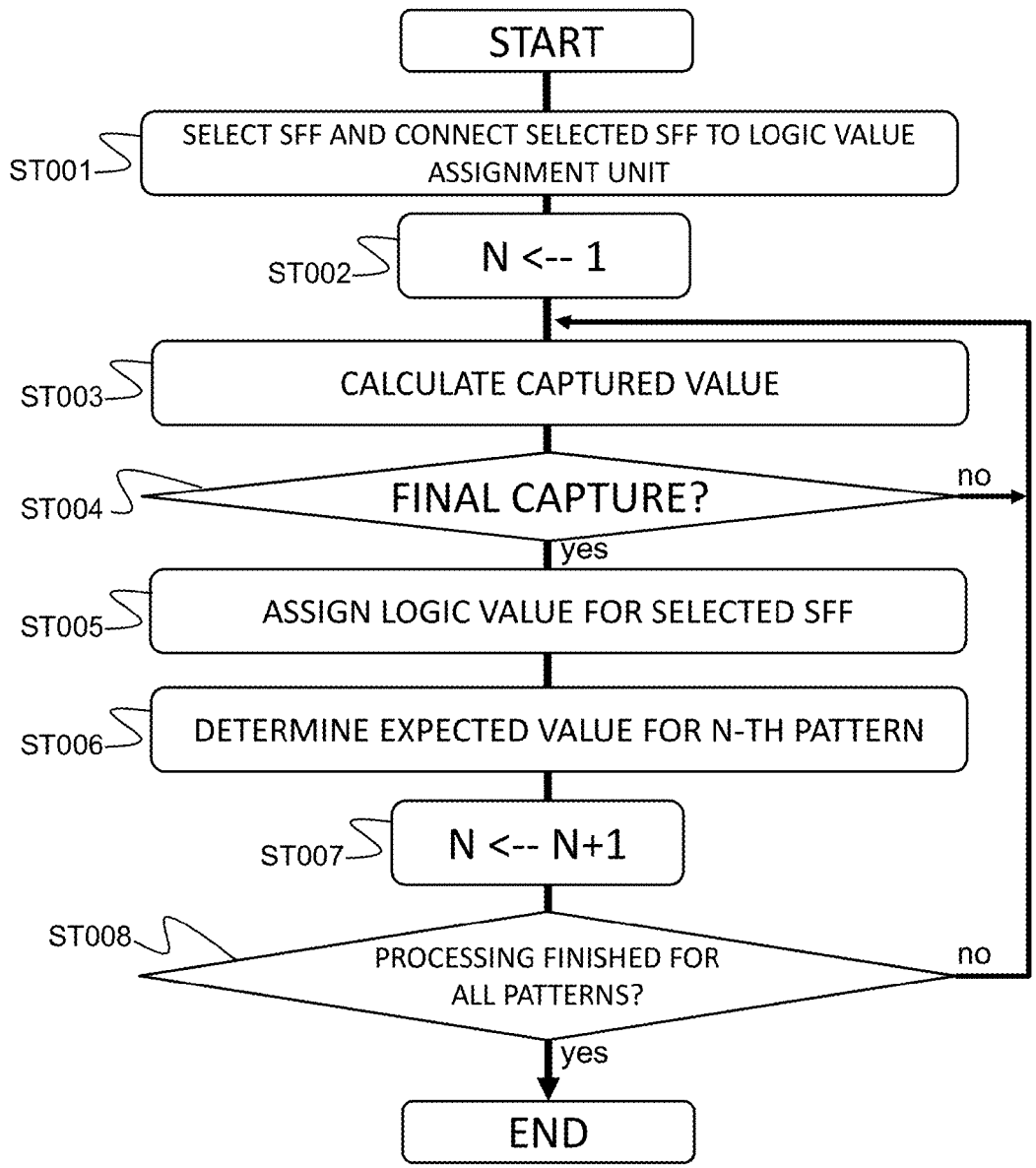
FIG. 3 is a flowchart showing an example procedure for generating an expected value by means of simulation.

Next, description will be made with reference to FIG. 3 regarding the generation of the expected value used to detect a fault in a case in which the logic value is supplied after the final capture. FIG. 3 is a flowchart showing an example of the procedure according to which the simulation unit 25 generates an expected value by means of simulation.

First, the selection unit 15 selects the SFF for which a logic value is to be assigned, and connects the SFF thus selected to the logic value assignment unit 9 (Step ST001). Next, a first test pattern for which an expected value is to be generated is selected (Step ST002). The simulation unit 25 calculates the logic value that will be captured from the combinational circuit portion 3 according to the test pattern thus selected (Step ST003). The logic values are captured repeatedly until it reaches the final capture. After the capture immediately before the final capture ends, the final signal generation unit 19 generates the final signal before the final capture (Step ST004).

After the final signal is generated, a logic value determination unit 17 determines the logic value to be assigned for each of the selected SFFs. Next, the logic value assignment unit 9 assigns the logic value thus determined for each of the selected SFFs (Step ST005). By performing this processing for all the SFFs, the expected value is determined for the selected test pattern (Step ST006). Subsequently, this processing loop is incremented (Step ST007), and judgment is made whether or not there is a test pattern for which the processing has not been performed (Step ST008). When there is a test pattern for which the processing has not been performed, the sequence from Step ST003 to Step ST008 is repeatedly performed until the processing has been performed for all the test patterns.

The comparison unit 27 makes a comparison between the expected value generated according to the flow shown in FIG. 3 and the logic value read out by the reading unit 11. The fault determination unit 29 performs fault judgment based on the comparison result.

Example 2

Description will be made regarding multiple example circuit configurations configured to supply a SFF with a logic value as a specified value. Description will be made in the present example regarding an example circuit configuration employing a multiplexer.

Figure 4:
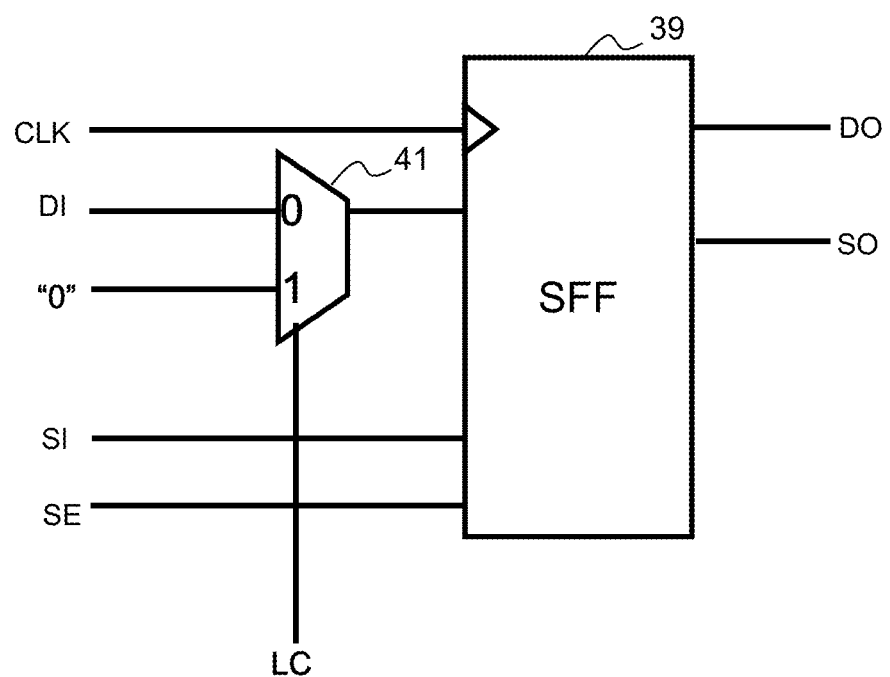
FIG. 4 is a diagram showing an example circuit configuration that supplies a predetermined logic value to a scan flip-flop by means of a multiplexer.

Referring to FIG. 4, a SFF 39, which is selected by the selection unit, is connected to the output stream of a multiplexer 41 configured such that the output signal line from the combinational circuit portion 3 and a signal line that supplies a logic value of 0 are each connected as its input stream, and the final signal is used as a selection control input signal.

In the capture mode, when a signal value of 0 is set for the final signal line, the multiplexer 41 supplies the DI signal value to the SFF 39. When a signal value of 1 is set for the final signal line, which means the final capture, a logic value of 0 is supplied to the SFF 39.

It should be noted that a logic value of 1 may be supplied to the SFF 39 via the multiplexer 41, instead of supplying a logic value of 0.

Example 3

Figure 5:
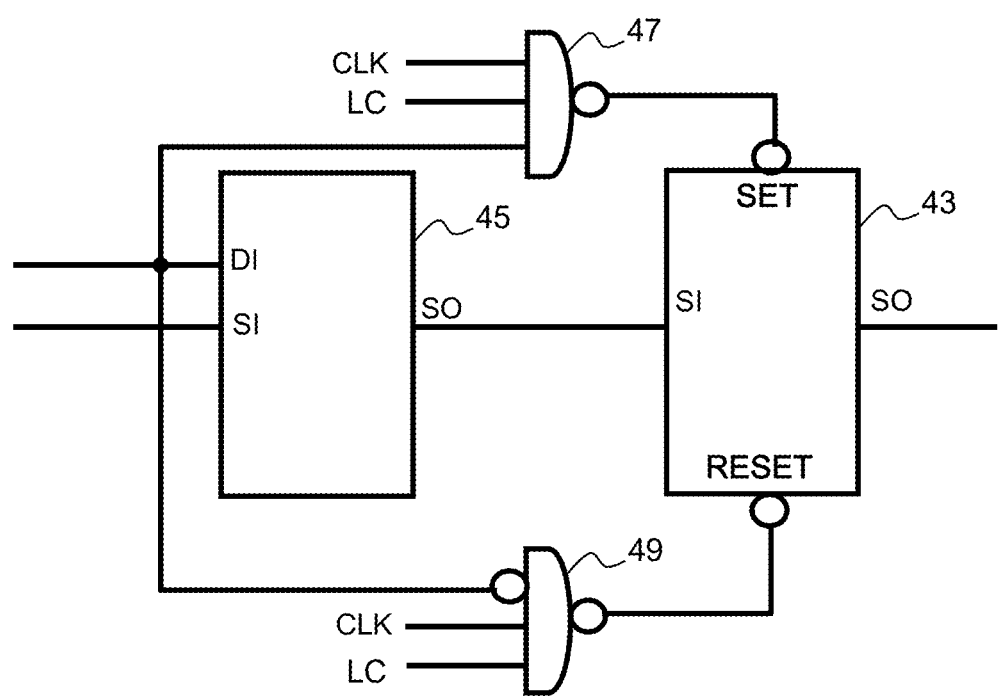
FIG. 5 a diagram showing an example circuit configuration that supplies a FF with the same logic value as that of an adjacent FF by means of set/reset input.

Next, description will be made regarding a circuit configuration configured to supply a given SFF with the same logic value as an adjacent SFF arranged in the scan chain. In FIG. 5, the output line of a NAND gate 47 is connected to the set terminal (SET) of a selected SFF 43 in a low-active state. The NAND gate 47 uses the capture output signal line of an adjacent SFF 45, the final signal line, and the clock signal line as its inputs. Furthermore, the output line of the NAND gate 49 is connected to the reset terminal of the SFF 43 in a low-active state. The NAND gate 49 uses, the inverted value of the capture output signal line of the adjacent SFF 45, the final signal line, and the clock signal line as its input.

When the final signal is supplied in the capture mode, and when the adjacent SFF 45 captures a logic value of 1, the SFF 43 receives a set input of 0 and a reset input of 1. In this case, low-active set is activated, and accordingly, the SFF 43 outputs 1. On the other hand, when the adjacent SFF 45 captures a logic value of 0, the SFF 43 receives a set input of 1 and a reset input of 0. In this case, reset is activated, and accordingly, the SFF 43 outputs 0.

As a result, when the final signal is supplied, the SFF 43 always holds the same logic value as that of the adjacent SFF 45. Thus, such an arrangement is capable of reducing the shift power required in the scan-out operation.

It should be noted that, as another configuration, one of the signal lines connected as the input stream of the multiplexer 41 shown in FIG. 4 may be connected to the capture input signal line of an adjacent SFF arranged in the scan chain, instead of being connected to the signal line that supplies a logic value of 0. Such an arrangement also allows the SFF 39 to hold the same logic value as that of an adjacent SFF.

Example 4

Next, description will be made regarding a circuit configuration configured to supply a given SFF with the same logic value as that of an adjacent SFF only when the given SFF has captured the same logic value in the final two captures in the capture mode.

Figure 6:
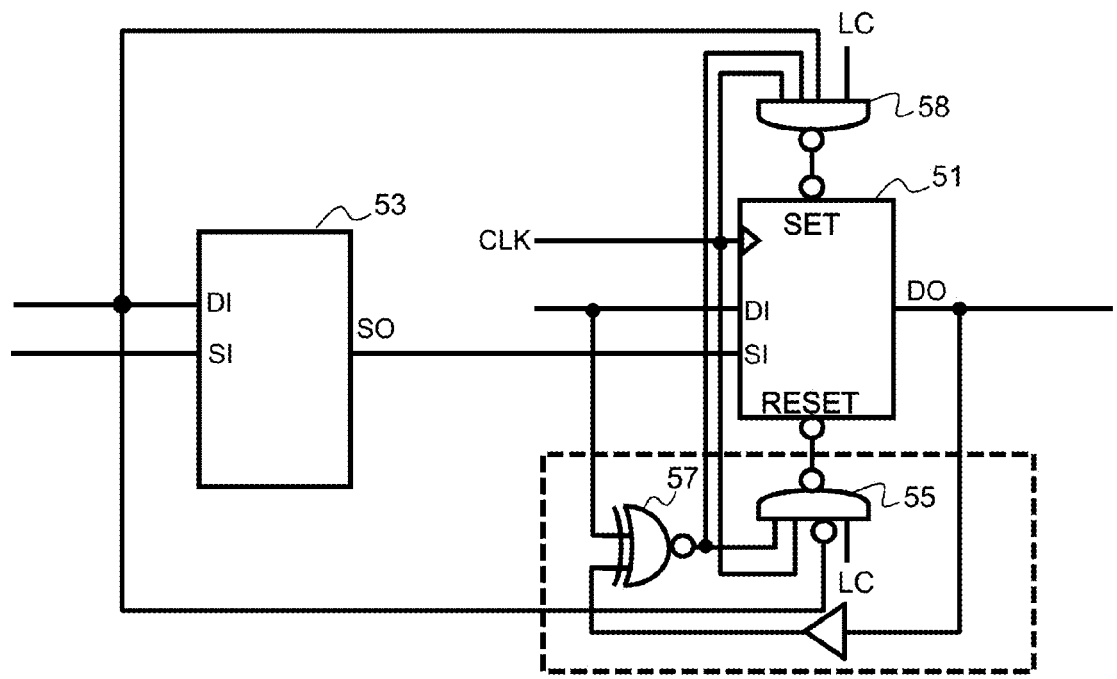
FIG. 6 is a diagram showing an example circuit configuration that provides a given SFF with the same logic value as that of an adjacent SFF by means of set/reset input when there is a difference in the logic value between the given SFF and the adjacent SFF.

Referring to FIG. 6, the reset terminal of a selected SFF 51 is connected to the output of a NAND gate 55. The NAND gate 55 receives, as its inputs, the inverted value of the signal set for the capture output signal line of an adjacent SFF 53 arranged in the scan chain, the signal set for the final signal line, the signal set for the clock signal line, and the inverted value of the signal set for the output signal line of a matching check circuit 57. The matching check circuit (XNOR gate) 57 receives the DI signal and the DO signal of the SFF 51 as its inputs.

When the signal values set for the final signal line and the clock signal line are both 1, when the DI signal value and the DO signal value of the SFF 51 are the same, and when the logic value DI captured by the adjacent SFF 53 is 0, the SFF 51 receives 0 as its reset input. In this case, the SFF 51 outputs 0.

Similarly, the output of a NAND gate 58 is connected to the set input of the SFF 51. The NAND gate 58 uses, as its inputs, the capture output line of the adjacent SFF 53, the final signal line, the clock signal line, and the output signal line of the matching check circuit 57. The SFF 51 receives 0 as its set input only when the logic value DI captured by the adjacent SFF 53 is 1. In this case, the SFF 51 outputs 1.

As described above, when the same logic value is captured by a given SFF in the final two captures, there is a high probability that such a FF does not contribute to improving the fault coverage. With the circuit according to the present example, by instructing the SFF 51 to capture the same logic value as that of the adjacent SFF 53, such an arrangement is capable of providing a logic value that has a high probability of reducing the shift power required in the scan-out operation.

Example 5

Figure 7:
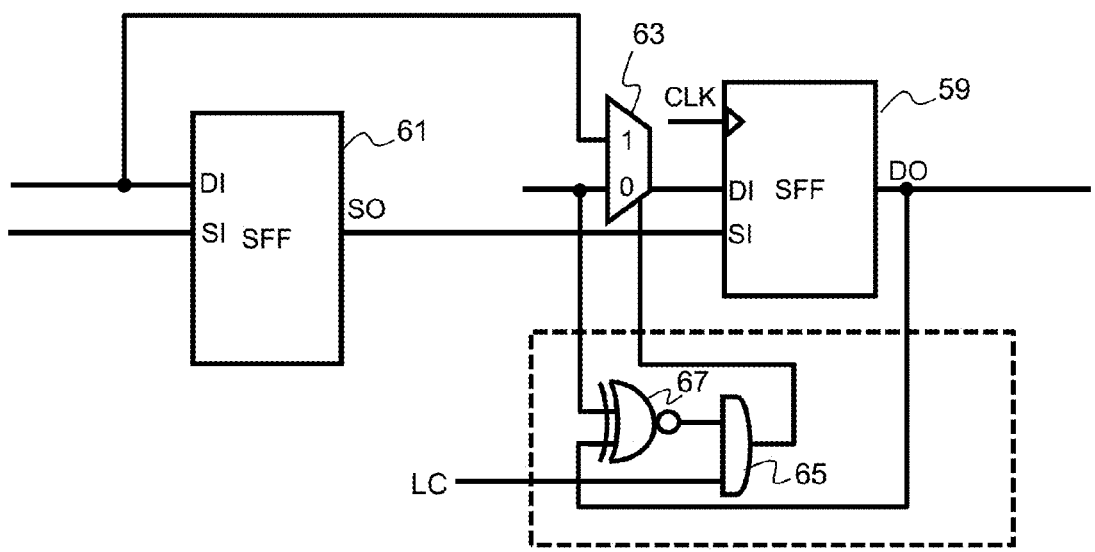
FIG. 7 is a diagram showing an example circuit configuration that provides a given SFF with the same logic value as that of an adjacent SFF by means of a multiplexer when there is a difference in the logic value between the given SFF and the adjacent SFF.

Referring to FIG. 7, description will be made as an example regarding a circuit that provides the same effects as those provided by the example 4 without involving the set/reset inputs.

A SFF 59 uses the output stream of a multiplexer 63 as its input. The multiplexer 63 uses, as its input stream, the output signal line extending from the combinational circuit portion 3 and the capture output signal line of an adjacent SFF 61. Furthermore, the multiplexer 53 uses the output of an AND gate 65 as its selection control input. The AND gate 65 uses the final signal line and the output line of the matching check circuit 67 as its inputs. The match circuit 67 receives the DI signal and the DO signal of the SFF 59 as its inputs.

When the value set for the final signal line is 0 (in captures other than the final capture), the SFF 59 captures the output of the combinational circuit portion 3 as it is. When there is a difference in the logic value between the DI and DO of the SFF 59, the SFF 59 l captures the output of the combinational circuit portion 3 as it is even when the value set for the final signal line is 1 (in the final capture). On the other hand, when the DI value and DO value of the SFF 59 are the same in the final capture, the SFF 59 captures the same value as that captured by the adjacent SFF 61.

Example 6

Next, description will be made regarding the rules used by the selection unit to select the SFF and the rules used by the logic value determination unit to determine the logic value. As described above, such a SFF may preferably be selected from among the SFFs for which intermediate acquisition is performed. As other methods, the rules described below may be applied, which allows the shift power required in the scan-out operation to be effectively reduced.

[Rule 1]

The SFF closer to the scan-in side is preferentially selected.

This is because an arrangement configured to match the logic values of adjacent SFFs closer to the scan-in side provides shift power reduction after more number of scan-shift than that provided by an arrangement configured to match the logic values of adjacent SFFs closer to the scan-out side.

[Rule 2]

In a case in which the value of a given SFF is assigned to the value held by the SFF arranged immediately before the given SFF, adjacent SFFs are not selected.

For example, let us consider a case in which four adjacent SFFs (SFF1 through SFF4) arranged in a scan chain capture a logic value of "1010" in the final capture. In this case, if the selection unit selects SFF 2 through SFF 4, and each of the selected SFFs supplied with the value of an adjacent SFF, SFF 2 through SFF 4 hold a logic value of 101" in the final stage according to the logic values captured by the SFFs 1, 2, and 3. That is to say, bit inversion remains in the logic value, leading to a problem in that the shift power cannot be reduced.

In order to solve such a problem, instead of selecting all the adjacent SFFs, alternate SFFs are selected, for example. In the aforementioned example, only SFF 2 and SFF 4 are selected. In this case, SFF 2 through SFF 4 hold a logic value of "111" in the final stage according to the logic values captured by the SFFs 1, 3, and 3. Thus, such an arrangement resolves the bit inversion problem, thereby allowing the shift power to be reduced.

[Rule 3]

In a case in which the adjacent SFF immediately before a given SFF has already been selected, and when the value of the adjacent SFF of the given SFF is assigned to the value of the SFF immediately before the adjacent SFF, the value of the given SFF is assigned to the value of the SFF two SFFs before the given SFF.

In a normal situation, no adjacent SFFs are preferably selected as described in rule 2 from the viewpoint of shift power reduction. However, there is a particular region in which the logic value of each SFF will change at a high frequency due to its design. In some cases, intermediate acquisition is intensively performed for the SFFs in such a region. With such an arrangement, in some cases, the selection unit selects adjacent SFFs. And then, rule 3 is effectively employed.

For example, let us consider a case in which three adjacent SFFs (SFF 5, SFF 6, and SFF 7) capture a logic value of "010" in the final capture. Furthermore, let us consider a case in which the selection unit selects the SFF 6 and SFF 7. According to rule 3, a logic value of 0, which is held by the SFF 5 that is adjacent to and immediately before the SFF 6, is finally assigned to the SFF 6. And, as the logic value held by the SFF 7 in the final stage, a logic value of 0, which is set for the SFF 5 that is two SFFs before the SFF 7, is assigned for the SFF 7 This is because the SFF 6, which is adjacent to and immediately before the SFF 7, is also selected. As a result, in the final stage, the SFFs 5 through 7 hold logic values of "000", which provides a reduction in the shift power.

It should be noted that description has been made above regarding an arrangement in which the logic value determination unit selects the logic value held by a single SFF as the logic value to be assigned for the selected SFF. As another method, the logic value to be assigned for the selected SFF may be determined with reference to the logic values held by multiple SFFs arranged before the selected SFF.

Also, the SFF selection rule in which the SFF is selected from among the SFFs connected to the acquisition circuit 10 and any one or more of rules 1 through 3 may be applied at the same time or separately.

Example 7

Description will be made below regarding experiment results showing the effects on reducing the shift power in the scan-out operation in a case of employing the fault detection system according to the present invention. As the test target circuits, the circuits s38417, s38584, and s35932, which are each configured as ISCAS89 benchmark circuits, and the circuits b14s, b15s, b20s, b21s, and b22s, which are each configured as ITC99 benchmark circuits, were used.

Table 3 shows the toggle rates of the SFFs in the scan-in operation and scan-out operation. The toggle rate represents the flip rate of the flip-flop in the scan-shift mode. As the flip rate of each FF becomes higher, the shift power becomes larger. Thus, a reduction in the toggle rate directly provides a reduction in the shift power. As the test target circuits, s38417, s38584, s35932, b14s, b15s, b17s, b20s, b21s, and b22s were employed. Furthermore, as comparative methods, only the test methods described in Patent documents 1 and 2 were employed. Table 2 shows the values in the fields indicated by "FIXED VALUE" and the values in the fields indicated by "ADJACENT VALUE", which represent the toggle rates in a case in which a fixed value is supplied to the selected SFFs and the toggle rates in a case in which the logic value of an adjacent SFF is supplied to the selected SFFs, respectively, using the test methods described in Patent document 1 and Patent document 2. As a multi-capture method (multiple captures are performed in the same capture mode), in the first and nine subsequent captures in a single capture mode, the capture was performed with a widened clock width, and the captured value was not observed. In the subsequent ten captures in the single capture mode, the capture was performed with a narrowed width, and the captured values were observed. The intermediate observation was performed for 20% of the total number of SFFs. It should be noted that the SFFs were selected at random.

TABLE 3

| | TOGGLE RATES IN SCAN-IN AND SCAN-OUT (%) | | | | | |
|---|---|---|---|---|---|---|
| | COMPARATIVE METHOD | | FIXED VALUE | | ADJACENT VALUE | |
| CIRCUIT | SI | SO | SI | SO | SI | SO |
| s38417 | 7.56 | 19.01 | 7.56 | 18.07 | 7.56 | 15.02 |
| s38584 | 7.89 | 18.68 | 7.89 | 16.98 | 7.89 | 15.71 |
| s35932 | 7.62 | 15.09 | 7.62 | 16.07 | 7.62 | 14.07 |
| b14s | 8.24 | 17.37 | 8.24 | 18.43 | 8.24 | 14.08 |
| b15s | 7.74 | 14.29 | 7.75 | 11.76 | 7.75 | 11.66 |
| b17s | 7.90 | 10.88 | 7.90 | 8.84 | 7.90 | 8.68 |
| b20s | 7.54 | 17.86 | 7.69 | 19.41 | 7.69 | 15.56 |
| b21s | 7.54 | 17.82 | 7.69 | 16.71 | 7.69 | 13.96 |
| b22s | 7.69 | 18.98 | 7.69 | 17.51 | 7.69 | 14.59 |
| AVE | 7.75 | 16.67 | 7.78 | 15.97 | 7.78 | 13.70 |

The shift power in the scan-in operation was maintained at the same low level using any one of the aforementioned methods. In contrast, the shift power in the scan-out operation was reduced on the order of 0.7% on average using the method in which a fixed value is supplied to the selected SFFs. Also, by using the method in which the logic value of an adjacent SFF is supplied to each selected SFF, the shift power was reduced on the order of 1% to 4%, and by approximately 3% on average.

It should be noted that, in the aforementioned experiment, the FFs were selected from among only the FFs for which the intermediate acquisition was performed. That is to say, the FFs can also be selected from among the FFs that have not flipped in the final two captures. Thus, such an arrangement has the potential to further reduce the shift power.

Development is being performed for semiconductor logic circuits configured with a very fine size on a very large scale and configured to operate with a low power supply voltage. Thus, it should be noted that such an arrangement provides a great effect even if it provides a reduction of only 1% in the toggle rate. With conventional techniques, it is difficult to reduce the shift power in the scan-out mode directly other than by using an indirect method in which the shift power in scan-in operation is reduced resulting in the reduction of shift power in the scan-in operation. Thus, it can be said that it is very significant to effectively reduce the shift power in the scan-out operation using the fault detection system and the like according to the present invention.

Example 8

Furthermore, description will be made regarding experiment results obtained using the fault detection system according to the present invention in a case in which the FFs for which the intermediate acquisition was to be performed were selected giving consideration to reducing the shift power, in addition to the fault coverage. Specifically, the FFs were selected giving consideration to reducing the shift power using the following three selection criteria.

[Criterion 1: Toggle Rate Density]

As the FFs for which the intermediate acquisition is to be performed, the FFs are selected while prioritizing a flip-flop from among the flip-flops positioned in a region having a high toggle rate.

[Criterion 2: Toggle Rate Density Analysis]

As the FFs for which the intermediate acquisition is to be performed, the FFs are selected while prioritizing a flip-flop from among the flip-flops each having a large effect on scan-out power when they toggle.

[Criterion 3: Moving Average]

Comparison is made between the value of a given FF and an average (moving average) of bits of adjacent FFs before and after the given FF. Next, the FFs are selected while prioritizing a FF from among the FFs each having a logic value which becomes different from the moving average many times.

Table 4 shows the toggle rates of the SFFs in the scan-in operation and the scan-out operation. Here, the values indicated by "fixed" each represent the toggle rate in a case in which a fixed value is assigned for the selected SFFs. The values indicated by "adjacent" each represent the toggle rate in a case in which the value of an immediately adjacent SFF or otherwise the value of a SFF two SFFs before or otherwise after the target SFF is assigned for the target SFF. The values indicated by "hybrid" each represent a value obtained by means of a hybrid control operation in which the value assigning mode is switched between the aforementioned "fixed" mode and the aforementioned "adjacent" mode according to the layout of the FFs thus selected.

It has been confirmed that the shift power in the scan-out operation is reduced in a sure manner using any one of the criteria 1 through 3, as compared with the experiment results shown in Table 3. Specifically, it has been confirmed that, in some cases, such an arrangement provides a marked reduction in shift power of 10% or more, depending on the circuit configuration. According to any one of the aforementioned criteria, such an arrangement exhibits a high shift power reduction effect in descending order of a case in which the hybrid control operation is performed, a case in which a fixed value is assigned for each selected SFF, and a case in which the value of an adjacent SFF is assigned for each selected SFF. In particular, in a case in which the hybrid control operation is performed, such an arrangement is capable of providing a shift power reduction effect in which there is a difference of only 2% or less in the shift power between the shift-in operation and the shift-out operation. It has been confirmed that, by appropriately selecting the FFs for which a specified value is to be assigned, the fault coverage of the case in Table 4 can be maintained at almost the same level as that of the case in Table 3.

TABLE 4

| CIRCUIT | INPUT | WITHOUT OUTPUT CONTROL | CRITERION 1 (TOGGLE DENSITY) | | | CRITERION 2 (TOGGLE RATE ANALYSIS) | | | CRITERION 3 (MOVING AVERAGE) | | |
|---|---|---|---|---|---|---|---|---|---|---|---|
| | | | FIXED | ADJACENT | Hybrid | FIXED | ADJACENT | Hybrid | FIXED | ADJACENT | Hybrid |
| b14 | 8.24 | 22.82 | 7.36 | 12.24 | 7.36 | 7.47 | 12.18 | 7.47 | 7.88 | 12.15 | 7.52 |
| b15 | 7.74 | 13.06 | 8.76 | 9.54 | 8.46 | 11.30 | 9.35 | 8.49 | 8.78 | 9.06 | 7.99 |
| b20 | 7.54 | 16.40 | 9.12 | 10.93 | 8.93 | 10.52 | 10.19 | 8.82 | 10.25 | 10.34 | 8.80 |
| b21 | 7.54 | 16.40 | 9.09 | 10.77 | 8.89 | 10.28 | 10.25 | 8.71 | 10.21 | 10.35 | 8.79 |
| b22 | 7.69 | 17.37 | 8.70 | 11.06 | 8.49 | 9.73 | 10.51 | 8.53 | 9.96 | 10.60 | 8.80 |
| AVE | 7.75 | 17.21 | 8.61 | 10.91 | 8.42 | 9.86 | 10.50 | 8.40 | 9.42 | 10.50 | 8.38 |

Figure 8:
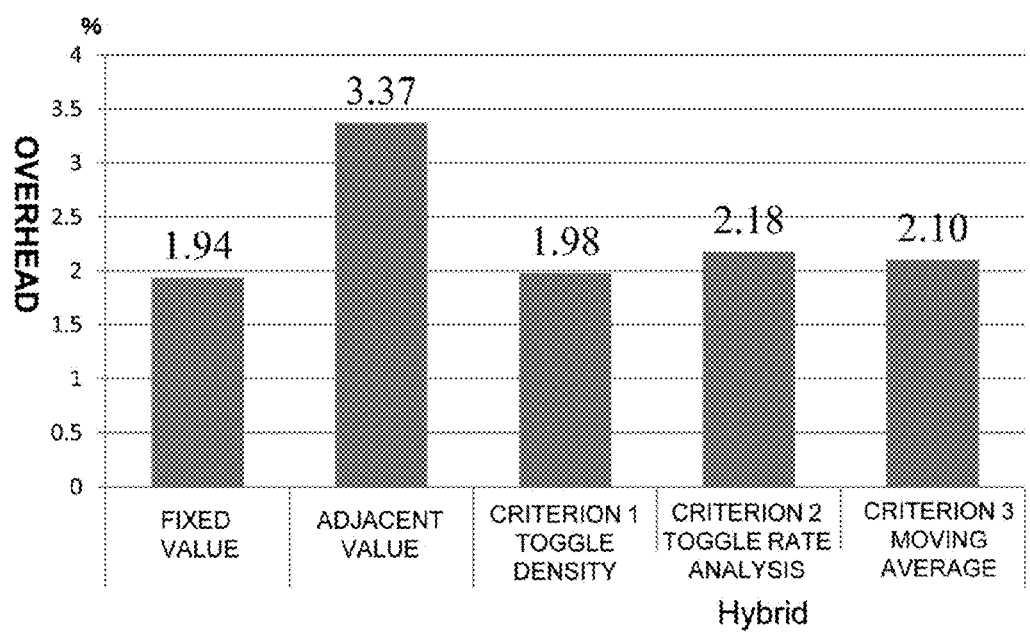
FIG. 8 is a graph showing the rate of increase in overhead.

Next, description will be made regarding the rate of increase in overhead involved in the fault detection system according to the present invention that exhibits the aforementioned marked advantages. FIG. 8 is a graph showing the rate of increase in overhead. In a case in which a fixed value is assigned for each selected FF, almost all the overhead originates due to the multi-capture operation. In a case in which the value of an adjacent FF is assigned for each selected FF, such an arrangement leads to a further increase in overhead of approximately 1.4%. In a case in which the hybrid control operation is employed, by assigning a fixed value for each of 75% or more of the selected FFs, such an arrangement is capable of maintaining the rate of increase in overhead at almost the same level as that in a case in which a fixed value is assigned for each selected FF. In particular, it has been confirmed that, by setting a fixed value for each of approximately 95% or more of the selected FFs, such an arrangement involves only a 0.04% rate of increase in overhead as compared with a case in which a fixed value is assigned for each of the selected FFs.

It should be noted that, in the selection in which the FFs are selected from among the FFs for which the captured logic value has not flipped in the final two captures, the selection unit 15 may select the FFs that have been judged to have a small effect on the fault coverage based on a simulation result obtained by the simulation unit. Also, judgment may be made whether the logic value of each FF that has not flipped is "0" or "1" by means of simulation, before the FFs are selected.

REFERENCE SIGNS LIST

1; fault detection system, 3; combinational circuit portion, 5; storage circuit portion, 6; flip-flop, 7; shift-in unit, 9; logic value assignment unit, 11; reading unit, 13; fault detection device, 15; selection unit, 17; logic value determination unit, 19; final signal generation unit, 21; capture-mode reading unit, 23; shift-mode reading unit, 25; simulation unit, 27; comparison unit, 29; fault determination unit.

The invention claimed is:
1. A fault detection system that detects, by means of a scan test, a fault that occurs in a logic circuit,
   wherein the fault detection system performs multiple captures in a single capture mode,
   the fault detection system comprising:
   a plurality of flip-flops;
   a final signal generation unit that generates a final signal which indicates a final capture in the single capture mode;
   an assignment unit that differs from the logic circuit and the flip-flops, and that assigns a logic value that reduces shift power to replace logic values of a part of the flip-flops when the final signal is received in advance of fault determination;
   a logic value determination unit that determines the logic value to be assigned by the assignment unit; and
   a fault detection device that detects a fault by making a comparison between a test output captured from the logic circuit and that includes the logic value assigned by the assignment unit and a test output obtained in a case in which the logic circuit has no fault and that includes the logic value assigned by the assignment unit, and
   wherein the final signal is generated after a capture immediately before the final capture in the single capture mode ends.
2. The fault detection system according to claim 1, further comprising:
   an acquisition circuit that connects directly to a part of or all of the flip-flops, without through another flip-flop, from which the acquisition circuit acquires a logic value; and
   a selection unit that selects a flip-flop for which the assignment unit assigns a logic value,
   and wherein the selection unit selects a flip-flop for which the logic value is assigned from among only flip-flops connected to the acquisition circuit so as to reduce shift power while maintaining fault coverage.
3. The fault detection system according to claim 2,
   wherein the selection unit selects a flip-flop for which a logic value is to be assigned, preferentially from among the flip-flops positioned in a region having a high toggle rate, the flip-flops each having a large effect on scan-out power when they toggle, or the flip-flops each having a logic value with a large difference from an average value of logic values of adjacent bits.

4. The fault detection system according to claim 2,
wherein the assignment unit assigns, for a flip-flop selected by the selection unit, one of logic values from among a constant logic value of 0 or otherwise 1, the same logic value with that of an adjacent flip-flop in the same scan chain, the same logic value with that of a flip-flop preceded by two flip-flops in the same scan chain, or a logic value determined with reference to logic values of a plurality of flip-flops.

5. The fault detection system according to claim 1, further comprising:
a selection unit that selects a flip-flop for which the assignment unit assigns a logic value,
and wherein the selection unit selects a flip-flop for which the logic value is assigned from among only flip-flops that each captures the same logic value at a final capture with a logic value captured immediately before the final capture so as to reduce shift power while maintaining fault coverage.

6. The fault detection system according to claim 5,
wherein, in a case in which the selection unit selects a plurality of flip-flops from the same scan chain, the selection unit selects the flip-flops such that they are not adjacent to each other,
and wherein the assignment unit assigns, for each of selected flip-flops, a logic value of an adjacent flip-flop in the same scan chain.

7. A generation circuit in a fault detection system that detects, by means of a scan test, a fault that occurs in a logic circuit, and the generation circuit generates and supplies a logic value to a flip-flop,
wherein the fault detection system performs multiple captures in a single capture mode,
wherein the generation circuit is configured as a circuit that differs from either the logic circuit or the flip-flop,
and the generation circuit includes:
an assignment unit that supplies a logic value that reduces shift power to replace logic values of the flip-flop after a final capture is performed in a capture mode and in advance of fault determination; and
a logic value determination unit that determines the logic value to be supplied by the assignment unit.

8. A fault detection method used in a fault detection system that detects, by means of a scan test, a fault that occurs in a logic circuit,
wherein the fault detection system performs multiple captures in a single capture mode, and
the fault detection method comprising:
a final signal generation step for generating a final signal which indicates a final capture in the single capture mode after a capture immediately before the final capture ends;
a logic value determination step for determining a logic value that reduces shift power for each flip-flop;
an assignment step for assigning the a logic value determined in the logic value determination step to replace logic values of a flip-flop in advance of fault determination; and
a fault detection step for detecting a fault detection by making a comparison between a test output captured from the logic circuit and that includes the logic value assigned in the assignment step and a test output obtained in a case in which the logic circuit has no fault and that includes the logic value assigned in the assignment step.

* * * * *